United States Patent
Castillo et al.

(10) Patent No.: US 8,308,993 B2
(45) Date of Patent: Nov. 13, 2012

(54) CONDUCTIVE INKS

(75) Inventors: Imelda Castillo, East Newark, NJ (US); Xuerong Gao, Livingston, NJ (US)

(73) Assignee: BASF SE, Ludwigshafen (DE)

( * ) Notice: Subject to any disclaimer, the term of this patent is extended or adjusted under 35 U.S.C. 154(b) by 196 days.

(21) Appl. No.: 12/022,403

(22) Filed: Jan. 30, 2008

(65) Prior Publication Data

US 2009/0188556 A1     Jul. 30, 2009

(51) Int. Cl.
*H01B 1/02* (2006.01)
*H01B 1/22* (2006.01)

(52) U.S. Cl. ............... 252/514; 106/31.92; 136/256; 427/74

(58) Field of Classification Search .......... 252/514, 252/519.21, 500, 519.2; 439/876; 156/89.16, 156/89.12, 230; 148/23; 73/721; 136/244, 136/256; 428/402; 524/81, 497; 106/31.92; 427/74
See application file for complete search history.

(56) References Cited

U.S. PATENT DOCUMENTS

| | | | |
|---|---|---|---|
| 3,545,986 A | 12/1970 | Short | |
| 3,755,723 A | 8/1973 | Short | |
| 5,162,062 A | 11/1992 | Carroll et al. | |
| 5,252,521 A | 10/1993 | Roberts | |
| 5,378,408 A | 1/1995 | Carroll et al. | |
| 5,406,852 A * | 4/1995 | Hiraka et al. | 73/721 |
| 5,439,852 A | 8/1995 | Hormadaly | |
| 5,468,695 A | 11/1995 | Carroll et al. | |
| 5,491,118 A | 2/1996 | Hormadaly | |
| 5,578,533 A | 11/1996 | Manabe et al. | |
| 5,645,765 A | 7/1997 | Asada et al. | |
| 5,714,420 A | 2/1998 | Sakoske | |
| 5,753,571 A | 5/1998 | Donohue | |
| 5,795,501 A | 8/1998 | Kano | |
| 5,882,722 A | 3/1999 | Kydd | |
| 5,891,283 A * | 4/1999 | Tani et al. | 156/89.18 |
| 6,036,889 A | 3/2000 | Kydd | |
| 6,255,239 B1 | 7/2001 | Sakoske | |
| 6,348,426 B1 | 2/2002 | Sanada et al. | |
| 6,703,438 B2 * | 3/2004 | Hareyama | 524/497 |
| 6,814,795 B2 | 11/2004 | McVicker et al. | |
| 7,138,347 B2 | 11/2006 | Konno | |
| 7,186,307 B2 * | 3/2007 | Hashimoto et al. | 156/89.12 |
| 7,211,205 B2 * | 5/2007 | Conaghan et al. | 252/514 |
| 7,691,294 B2 * | 4/2010 | Chung et al. | 252/500 |
| 7,727,424 B2 | 6/2010 | Konno | |
| 2002/0058141 A1 * | 5/2002 | Hareyama | 428/402 |
| 2002/0124910 A1 * | 9/2002 | Miyazaki et al. | 148/23 |
| 2003/0224205 A1 | 12/2003 | Li et al. | |
| 2004/0060646 A1 * | 4/2004 | Hashimoto et al. | 156/230 |
| 2004/0155227 A1 | 8/2004 | Bechtloff et al. | |
| 2005/0037910 A1 | 2/2005 | Konno | |
| 2006/0231801 A1 | 10/2006 | Carroll et al. | |
| 2006/0231803 A1 | 10/2006 | Wang et al. | |
| 2006/0289055 A1 | 12/2006 | Sridharan et al. | |
| 2006/0292938 A1 * | 12/2006 | Schwenke et al. | 439/876 |
| 2007/0138659 A1 | 6/2007 | Konno | |
| 2007/0187652 A1 * | 8/2007 | Konno | 252/500 |
| 2007/0215203 A1 | 9/2007 | Ishikawa et al. | |
| 2007/0225409 A1 * | 9/2007 | Matsumoto | 524/81 |
| 2007/0253140 A1 | 11/2007 | Randall et al. | |
| 2008/0206488 A1 | 8/2008 | Chung et al. | |
| 2009/0188555 A1 | 7/2009 | Castillo et al. | |

FOREIGN PATENT DOCUMENTS

| | | |
|---|---|---|
| EP | 0064211 | 11/1982 |
| EP | 0761617 | 3/1997 |
| EP | 1506944 A1 | 2/2005 |
| EP | 1713094 A2 | 10/2006 |
| EP | 1801891 A1 | 6/2007 |
| EP | 2015367 | 1/2009 |
| FR | 2348897 | 11/1977 |
| JP | 2281082 | 11/1990 |
| JP | 3280414 | 12/1991 |
| JP | 6-057183 | 3/1994 |
| JP | 06-057183 * | 3/1994 |
| JP | 07126037 | 5/1995 |
| JP | 2000264676 | 9/2000 |
| JP | 2005/243500 | 8/2005 |
| JP | 2005247602 | 9/2005 |
| JP | 2005281171 | 10/2005 |
| JP | 2006225255 | 8/2006 |
| JP | 3853793 | 9/2006 |
| JP | 2007049087 | 2/2007 |
| JP | 2007/235082 | 9/2007 |
| WO | WO-01/54203 A2 | 7/2001 |
| WO | WO-02082466 | 10/2002 |
| WO | WO-03/045584 A1 | 6/2003 |

(Continued)

OTHER PUBLICATIONS

Non-Final Office Action in U.S. Appl. No. 12/022,294, (Sep. 11, 2009), 50 pgs.

(Continued)

*Primary Examiner* — Khanh Tuan Nguyen
(74) *Attorney, Agent, or Firm* — Diehl Servilla LLC

(57) ABSTRACT

A conductive ink substantially free of frit and photovoltaic cells having conductive gridlines formed from a conductive ink substantially free of glass frit are described. Conductive inks according embodiments of the present invention are adapted to adhere to the surface of a substrate and, upon firing, form a solid metal oxide phase and cause a conductive species to form an electrical conductor on the substrate. In further embodiments, the conductive ink is capable of penetrating anti-reflection coatings disposed on surfaces of substrates. In accordance with one or more embodiments, the conductive inks include a plurality of metallo-organic components which form a solid metal oxide phase upon firing and a conductive species. In other embodiments, the conductive inks include a plurality of precursors, including one or more precursors which form conductive elements upon firing or heating.

18 Claims, No Drawings

FOREIGN PATENT DOCUMENTS

| WO | WO-03106573 | | 12/2003 |
|---|---|---|---|
| WO | WO-2004067647 | | 8/2004 |
| WO | WO-2006/008896 | | 1/2006 |
| WO | WO 2006/093398 | * | 6/2006 |
| WO | WO-2006/132766 A2 | | 12/2006 |
| WO | WO-2007/089273 A1 | | 8/2007 |

OTHER PUBLICATIONS

"Thomson Scientific, London, GB", *Database WPI Week 199528*, XP002526317, (May 16, 1995), 1-8 pgs.

"Thomson Scientific, London, GB", *Database WPI Week 200666*, XP002526318, (2006), 1-9 pgs.

"Thomson Scientific, London, GB", *Database WPI Week 200115*, XP00252319, (2001), 1-9 pgs.

"Thomson Scientific, London, GB", *Database WPI Week 200566*, XP002526320, (2005), 1-9 pgs.

PCT International Search Report for PCT/US2009/032107, (May 13, 2009), 4 pgs.

PCT International Search Report for PCT/US2009/032109, (May 8, 2009), 4 pgs.

"Thomson Scientific, London, GB", *Database WPI Week 199101*, XP002524728, (1991), 1-9 pgs.

"Thomson Scientific, London, GB", *Database WPI Week 199205*, XP002524727, (1992), 1-5, 8, 9 pgs.

PCT International Search Report for PCT/US2009/032112, (May 11, 2009), 4 pgs.

Sabo, C. J., et al., "Silver Thick Film Metallization for Photovoltaics Fired at 3000° C.", *Proc. Int. Soc. for Hybrid Microelectron. Symp.*, Anaheim, CA, (1985), 59-66 pgs.

Non-Final Office Action in U.S. Appl. No. 12/022,358, mailed Dec. 30, 2009, 22 pgs.

"Final Office Action mailed May 19, 2010" in U.S. Appl. No. 12/022,358, filed Jan. 30, 2008, 19 pgs.

Final Office Action mailed May 19, 2010, U.S. Appl. No. 12/022,358, filed Jan. 30, 2008, 19 pgs.

Non-Final Office Action, U.S. Appl. No. 12/022,358 Sep. 16, 2010, 11 pgs.

Final Office Action in U.S. Appl. No. 12/022,358 mailed Feb. 17, 2011, 12 pgs.

"Office Action of Dec. 23, 2011" in U.S. Appl. No. 12/022,358, filed Jan. 30, 2008 , 12 pages.

Sabo, C. J., et al., "Silver Thick Film Metallization for Photovoltaics Fired at 300° C.", *Materials Engineering*, Purdue University, pp. 59-65, Jul. 28, 2005.

Vest, G. M., et al., "Copper films from aqueous solutions of copper nitrate trihydrate", *Thin Solid Films*, Purdue University, Abstract, pp. 77-82, (1991).

Vest, G. M., et al., "MOD silver metallization for photovoltaics", *Energy Res. Abstr.*, Purdue Univ., (1985).

Vest, M. G., et al., "Synthesis of metallo-organic compounds for metallo-organic decomposition (MOD) powders and films", *Materials Research Society Symposium Proceedings*, Purdue University, Abstract, pp. 35-42, (1986).

Final Office Action in U.S. Appl. No. 12/022,358, dated Jun. 1, 2012, 9 pgs.

* cited by examiner

CONDUCTIVE INKS

TECHNICAL FIELD

Embodiments of the present invention relate to conductive inks that are substantially free of glass frit and photovoltaic cells having conductive grid lines formed from conductive inks that are substantially free of glass frit.

BACKGROUND

Conductive inks or pastes are used to form metal contacts, such as silver gridlines and bus bars, on the surface of substrates such as silicon. Such substrates can be used in solar cells or photovoltaic cells that convert solar energy to electrical energy when photons from sunlight excite electrons in semiconductors from the valance band to the conduction band. The electrons which flow in the conduction band are collected by the metal contacts. Crystalline silicon solar cells in today's industry are typically coated with an anti-reflection coating to promote light adsorption, which increases cell efficiency. However the anti-reflection coating also works as an insulator by preventing electrons from transferring from the substrate to the metal contacts. The anti-reflection coatings often comprise silicon nitride, titanium oxide or silicon oxide.

Conductive inks typically include a glass frit, metal particles or conductive species and an organic medium. The metal particles, usually silver particles, provide conductive properties and function as current collectors after formation of the metal contacts. To form the metal contacts, conductive inks are printed onto the substrate. The substrate is then fired at a temperature in the range of about 650° C. to about 950° C. In most instances, a sintering aid is needed because the firing temperature used is lower than the eutectic point of silver and silicon, and the silver melting point. In addition, the conductive ink should penetrate the anti-reflection coating to form metal contacts having ohmic contact with the substrate.

Conventional conductive pastes incorporate glass frits to aid with sintering the metal particles to a substrate and to promote adhesion and ohmic contact between the formed metal contact and the substrate. Depending on the formulation, glass frits can liquefy upon firing at a temperature between about 300° C. and 600° C. When the glass frit liquefies, it tends to flow toward the interface between the metal particles or silver particles and the anti-reflection coating disposed on the substrate. The melted glass dissolves the anti-reflection coating materials as well as some of the silver and substrate. Once the temperature decreases, the molten silver and the melted or dissolved substrate recrystallize through the liquid phase. As a result, some of the silver crystallites are able to penetrate the antireflective layer and form ohmic contact with the substrate. This process is referred to as "fire-through" and facilitates a low contact resistance formation and a stronger bond between silver and the substrate.

As will be discussed herein, glass frits are not believed to be ideal materials for use in the fire-through process and, therefore, a need for substitute materials exists. The use of metallo-organics in conductive inks, which do not include glass frit, is discussed in the article entitled *Silver Thick Film Metallization for Photovoltaics Fired at* 300° C.," by C. J. Sabo, et al. (herein referred to as the "Sabo Article"). The Sabo Article specifically discusses using a silver metallo-organic component, such as silver neodecanoate, in a conductive paste or ink to be screen printed onto a silicon wafer to form gridlines. The Sabo Article abstract states that printed inks were applied to silicon wafers or solar cells, dried for 30 minutes at 65° C. and fired at a maximum temperature of 300° C. for 70 minutes.

Accordingly, there continues to be a need for other glass frit substitutes for use in conductive inks which aid in sintering, reduce resistivity in photovoltaic applications, and also have the capability of promoting adhesion and ohmic contact through anti-reflection coatings.

SUMMARY

According to one aspect of the present invention, conductive inks are provided which utilize etching agents that provide similar functions as glass frits during the firing process. Specifically, one or more embodiments of the present invention pertain to a conductive ink which includes a plurality of metallo-organic components and a conductive species, where the metallo-organic components form a solid metal oxide phase upon firing or heating. In at least one embodiment, the conductive ink is substantially free of frit. As used throughout this application, the term "substantially free of frit" shall mean having glass frit in an amount less than about 1% by weight. Further, as used throughout this application, the terms "paste" and "ink" shall be used interchangeably.

While the present invention should not be bound by theory, it is believed that glass frits are not ideal materials for the fire-through process because glass is not a conductive material. In particular, glass has the tendency to cap the silver crystallites at the metal contact-substrate interface. Moreover, glass forms an insulating phase and interferes with electron flow. Applying conductive inks incorporating glass frits using ink-jet printing methods can also be problematic as the coarse particulates of the frit can clog or obstruct the parts.

According to one or more embodiments of the invention, the conductive ink can be substantially free of frit and also omit the use of the conductive species by instead using a plurality of precursors, wherein one or more of the precursors form a solid metal oxide phase and one or more conductive metal elements upon firing.

In one embodiment of the present invention, conductive inks are adapted to adhere to the surface of a substrate upon application to the substrate in the absence of a frit. In another embodiment, upon firing, the conductive ink is adapted to decompose the metallo-organic components and any other organic medium, to form a solid metal oxide phase and to cause the conductive species to form an electrical conductor on the substrate. According to another embodiment, upon firing or heating, a conductive ink having a plurality of precursors is adapted to decompose the precursors and any organic medium, form a solid oxide phase, and cause the one or more conductive metal elements generated to form an electrical conductor on the substrate.

When a conductive ink according to one or more embodiments is applied to an anti-reflection coating disposed on the substrate, the conductive ink is capable of penetrating the anti-reflection coating to form ohmic contact with the substrate.

In a further embodiment, the conductive ink utilizes a conductive species such as silver powder. In another embodiment, the conductive species utilized in the conductive ink is capable of being sintered at a temperature greater than about 500° C.

In one or more embodiments, the metallo-organic components are present in the conductive inks in an amount less than about 40% by weight. In another embodiment the plurality of precursors are present in the conductive inks in an amount less than about 90% by weight. Metallo-organic components and/or precursors according to one or more embodiments include one or more metal elements selected from Group IIIA, Group IVA, Group VA, titanium, vanadium or zinc. More specific embodiments utilize metallo-organic components and/or precursors which include metal elements selected from boron, aluminum, silicon, bismuth, zinc, vanadium or titanium.

According to another embodiment of the present invention the conductive ink can also incorporate one or more phosphorus-containing compounds, modifiers, including a metal oxide, and/or colloidal metal suspensions.

Another aspect of the present invention pertains to a photovoltaic cell comprising a semiconductor substrate, an anti-reflection coating, and conductive grid lines formed from a conductive ink that is substantially free of frit. In one embodiment, the conductive ink includes an organic medium, a conductive species and a plurality of metallo-organic components. In another embodiment, the conductive ink includes one or more precursors capable of forming one or more conductive metal elements upon firing. Further, the conductive ink used in one embodiment of the photovoltaic cell has been fired to form gridlines having a metal oxide phase and a conductive species and has been processed to remove the organic medium and sinter the conductive species. The conductive species used in another embodiment is a silver powder and/or is capable of being sintered at a temperature greater than about 500° C. In a further embodiment, the conductive ink is disposed on an anti-reflection coating and is capable of penetrating the anti-reflection coating to form ohmic contact with the substrate. The anti-reflection coating on which the conductive ink is deposited in one or more embodiments exhibits high resistivity that impedes the charge carrier transfer in the circuit.

The foregoing has outlined rather broadly certain features and technical advantages of the present invention. It should be appreciated by those skilled in the art that the specific embodiments disclosed may be readily utilized as a basis for modifying or designing other structures or processes within the scope of the present invention. It should also be realized by those skilled in the art that such equivalent constructions do not depart from the spirit and scope of the invention as set forth in the appended claims.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Aspects of the present invention incorporate conductive species and/or precursors to form a conductive ink being substantially free of frit, which will now be discussed in greater detail. Precursors can be an inorganic precursor such as a metal salt (for example, silver nitrate) or a metallo-organic component that forms a conductive metal element upon firing.

Precursors

Certain embodiments omit the use of conductive species and, instead, utilize precursors that, upon firing, form one or more conductive metal elements. As used herein, the term "conductive metal elements" includes copper, silver, gold, platinum and/or other precious metals and combinations thereof. One or more embodiments utilize both conductive species and precursors which form conductive metal elements.

The use of precursors which form conductive metal elements upon firing can be useful to form inks without metal particles for thin film applications. While the present invention should not be bound by theory, it is believed that particulate-free inks or inks which do not utilize conductive species prevent agglomeration issues that can arise during application of conductive inks by direct printing, such as by spray or ink-jet print processes.

Metallo-Organic Components

One or more embodiments of the present invention include conductive inks having more than one metallo-organic precursor. Generally, metallo-organics are compounds containing metal atoms, including metal carboxylate such as neodecanoates, acetates and propionates, metal alkoxide and metal complexes, which are sparingly soluble or insoluble in water. Metallo-organics can also contain any aromatic or aliphatic groups and are sometimes referred to as metal resinates when the organic portion consists of groups derived from resins or other natural products. Other suitable metallo-organic precursors include metal mercaptides. The metallo-organic components used in one or more embodiments can have more than one metal atom.

Examples of metallo-organic components used with one or more conductive inks include a combination of boron-metallo-organic, aluminum-metallo-organic, silicon-metallo-organic, bismuth-metallo-organic, zinc-metallo-organic and vanadium-metallo-organic components. Sometimes metallo-organics and organo-metallics are defined as two categories. As used throughout this application, the term "metallo-organic" includes both metallo-organics and organo-metallics.

While the present invention should not be bound by theory, it is believed that, upon firing, the metallo-organic components will decompose and the organic portions are removed from the ink. Further, metal or metal alloy or oxide mixtures can be generated. The amount of solid material generated after firing is referred as "solid content of the metallo-organic components by weight percent." In accordance with one or more embodiments, the metallo-organic components should be present in the ink in an amount sufficient to generate at least 0.5% solid content by weight percent. Other embodiments have metallo-organic components having at least 2-3% solid content by weight percent. Without being limited by theory, it is believed that, as with the use of glass frit in conductive inks, the amount of solid material generated by metallo-organic influences the ability of the conductive ink to form an electrical conductor on or form ohmic contact with the substrate. This ability consequently, drives the performance of the device that incorporates the conductive ink, such as a semiconductor, a photovoltaic cell or an automotive glass. As stated otherwise herein, one or more embodiments of the invention utilize more than one metallo-organic component. While the present invention should not be bound by theory, it is believed that the use of more than one metallo-organic in a conductive ink reduces resistivity to a greater degree than the use of only one metallo-organic component.

In one or more embodiments of the invention, the metallo-organic components included bismuth metallo-organics, silicon metallo-organics and boron metallo-organics. Other embodiments can include at least one metallo-organic component selected from bismuth metallo-organics, silicon metallo-organics and/or boron metallo-organics. Further embodiments can include one or combinations of bismuth metallo-organics, silicon metallo-organics, boron metallo-organics, aluminum metallo-organics, zinc metallo-organics and/or vanadium metallo-organics.

According to one or more embodiments, to achieve desired properties, single element or metal oxides or colloidal metal suspensions can be added to the metallo-organic components as modifiers to enhance a certain element content or bring in new properties. For example, phosphorous, $P_2O_5$ or other type of phosphorous-contained compound can be added to make self-doping pastes for use in solar cell applications.

In addition, base metal metallo-organic components can improve the film bonding in low temperature applications. For example, silver powders, nano-silver suspensions and base metal metallo-organic components provide good conductivity and bonding to ceramic and conformal substrates. The conformal substrates can include but are not limited to soft substrates, such as Mylar®, Kapton®, Kaladex® and Melinex®.

Methods known in the art can be used to formulate the plurality of metallo-organic components used with the conductive inks according to embodiments of the present invention.

Additional factors for formulating metallo-organic components may be considered to adjust the resulting properties. One consideration includes controlling the aggressiveness of the conductive ink on the anti-reflection coating and to avoid contamination of the substrate. Another consideration includes selecting a thermal decomposition temperature in the range from about 200° C. to about 500° C. or in another range depending on the firing profile, to provide enough time and heat for the solid mixtures decomposed from the metallo-organic components to react with the conductive species and anti-reflection coating. The use of metal carboxylates or low temperature chemical vapor deposition ("CVD") precursors can be considered for adjusting the decomposition temperature. A third consideration includes selecting metallo-organic components which have a consistency suitable for printing or which can also be used as rheology modifiers.

Conductive Species

In one or more embodiments, the conductive ink utilizes a conductive species such as silver in powdered or particulate form. Other non-limiting examples of suitable conductive species include conductive metals such as gold, copper and platinum in powdered or particulate form.

The conductive species used in one or more embodiments can be in the form of one or more fine powders of silver metal or silver alloys. According to one or more embodiments, the conductive species should be capable of being sintered at a temperature greater than about 500° C.

Other Components

The conductive ink according to one or more embodiments may also include an organic vehicle. The organic vehicle disperses the particulate components and facilitates transfer of the ink composition onto a surface. In at least one embodiment, the organic vehicle includes any suitably inert solvent, resins and commonly used surfactants. Specifically, the organic vehicle dissolves the resins and disperses the conductive species and metallo-organic components to form a conductive ink having suitable rheology. Various organic vehicles with or without thickening agents, stabilizing agents and/or other common additives are suitable for use in the preparation of the embodiments of the present invention. Examples of solvents include alcohols (including glycols) as well as esters of such alcohols, terpenes such as pine oil, terpineol and the like. More specific solvents include dibutyl phthalate, diethylene glycol monbutyl ether, terpineol, isopropanol, tridecanol and 2,2,4-trimethyl-1,3-pentanediol monoisobutyrate. Some embodiments utilize solvents that also contain volatile liquids to promote faster drying after application to a substrate.

Examples of suitable resins include ethyl cellulose, methyl cellulose, nitrocellulose, carboxymethyl cellulose and other cellulose derivatives. Other examples include resins such as acrylic acid esters, methacrylic acid esters, polyvinyl alcohols, polyvinyl butyrals and polyketones.

In one specific embodiment, solutions of resins such as polymethacrylates of lower alcohols are used, while in a more specific embodiment, the organic vehicle includes ethyl cellulose in solvents such as pine oil and monobutyl ether of diethylene glycol.

According to one or more embodiments, the ratio of organic vehicle to solids in the conductive ink can vary considerably and is determined by the final desired formulation rheology which, in turn, is determined by the printing requirements of the system. In one or more embodiments, the conductive ink can contain about 50 to about 95% by weight solids and about 5 to about 50% by weight organic vehicle.

One or more embodiments of the conductive inks may additionally comprise further additives known in the art, such as colorants and staining agents, rheology modifiers, adhesion enhancers, sintering inhibitors, green-strength modifiers, surfactants and the like.

The conductive ink according to one or more embodiments may be prepared by suitable equipment, such as a triple-roll mill. Conductive species, metallo-organic components, precursors, organic vehicles and any other additives can be premixed well then dispersed with a triple-roll mill.

Photovoltaic Cells

Another aspect of the present invention provides for PV cells comprising a semiconductor substrate, an anti-reflection coating on the substrate and conductive gridlines. According to one or more embodiments, the conductive gridlines are formed from a conductive ink substantially free of frit. One or more of the embodiments of conductive inks disclosed herein can be used to form the conductive gridlines. According to one or more embodiments, more than one metallo-organic component is desired so that the conductive ink can penetrate or dissolve the anti-reflection coating on the substrate and establish ohmic contact.

In one or more embodiments, the semiconductor substrate can be silicon. Other suitable substrates known in the art can be utilized, such as doped semiconductor substrates. According to one or more embodiments, the anti-reflection coatings can comprise titanium oxide, silicon nitride or other coatings known in the art.

The semiconductor substrate may comprise monocrystalline or polycrystalline silicon. The anti-reflection coatings can be applied to the substrate using chemical vapor deposition techniques. In some embodiments, plasma enhanced chemical vapor deposition techniques are used to apply the anti-reflection coating. Semiconductor substrates according to one or more embodiments may also be etched or textured to reduce reflection of sunlight and enhance the level of absorption. According to one or more embodiments, the conductive ink is thereafter applied to the surface of the substrate or anti-reflection coating by screen printing or other technique. The substrate is heated or fired to a temperature of about 650° to 950° C. to form grid lines in one embodiment. As otherwise discussed in this application, the firing process allows the glass frit of known conductive inks to melt and penetrate the anti-reflection coating. The conductive species used in conductive inks according to one embodiment of the invention forms crystallites at the interface of conductors and the substrate, which enhances electrical or ohmic contact between the conductors and the semiconductor substrate. In embodiments that utilize a plurality of precursors, upon firing, the one or more precursors form one or more conductive elements which promote the formation of electrical conductors on the substrate.

Without intending to limit the invention in any manner, embodiments of the present invention will be more fully described by the following examples.

EXAMPLES

Two inks or pastes (Ink A and Ink B) were tested, wherein both inks included silver powders, a plurality of metallo-organic components, resins and solvents. The amount of metallo-organic components in Ink A generated 2% solid content by weight and the amount of metallo-organic components in Ink B generated 3% solid content by weight. The inks were printed and formed front contacts on two crystalline silicon solar cells. The performance of each solar cell was measured, with the values normalized with respect to Ink A, and reproduced in Table 1.

TABLE 1

Effect of solid content generated by metallo-organic components in the paste.

| Ink | Solid Content | $V_{oc}$ (V) | $J_{sc}$ (mA/cm$^2$) | Fill Factor | Efficiency (%) |
|---|---|---|---|---|---|
| A | 2% | 1.00 | 1.00 | 1.00 | 1.00 |
| B | 3% | 0.99 | 1.03 | 1.75 | 1.78 |

The "fill factor" and "efficiency" are measures of the performance of a semiconductor. The term "fill factor" is defined as the ratio of the maximum power ($V_{mp} \times J_{mp}$) divided by the product of short-circuit current density ($J_{sc}$) and open-circuit voltage ($V_{oc}$) in current-voltage (I-V) characterization of solar cells. The open circuit voltage (Voc) is the maximum voltage obtainable under open-circuit conditions. The short circuit current density ($J_{sc}$) is the maximum current density without the load under short-circuit conditions. The fill factor (FF), is thus defined as $(V_{mp}J_{mp})/(V_{oc}J_{sc})$, where $J_{mp}$ and $V_{mp}$ represent the current density and voltage at the maximum power point.

The term "efficiency" is the percentage of power converted (from absorbed light converted to electrical energy) and collected when a solar cell is connected to an electrical circuit. Efficiency ($\eta$) is calculated using the ratio peak power ($P_m$) divided by the product of total incident irradiance (E, measured in Wm$^{-2}$) and device area (A, measured in m$^2$) under "standard" test conditions where $\eta = P_m/(E \times A)$.

As shown in Table 1, Ink B exhibited a greater fill factor and efficiency than Ink A. Based on these results, it is believed that a conductive ink yields greater fill factor and efficiency when the metallo-organic components contained therein generate a higher solid content.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A conductive ink for application to a semiconductor substrate for use as a photovoltaic cell comprising a plurality of solid metal oxide phase-forming components comprising metallo-organic components that form a solid metal oxide phase upon firing, the metallo-organic components comprising silicon and boron and optionally bismuth; and a conductive species, the ink being substantially free of glass frit and the ink adapted to adhere to the surface of a substrate upon application to the substrate in the absence of a frit and, upon firing, to decompose the metallo-organic components to form the solid metal oxide phase and to cause the conductive species to form an electrical conductor on the substrate.

2. The ink of claim 1, wherein upon application of the ink to an anti-reflection coating disposed on the substrate, the conductive ink is capable of penetrating the anti-reflection coating to form ohmic contact with the substrate.

3. The ink of claim 1, wherein the conductive species comprises silver powder.

4. The ink of claim 1, wherein the conductive species is capable of being sintered at a temperature greater than about 500° C.

5. The ink of claim 1, wherein the metallo-organic components are present in an amount less than about 40% by weight.

6. The ink of claim 1, wherein the metallo-organic components further comprise one or more of aluminum, gallium, indium, thallium, germanium, tin, lead, arsenic, antimony, titanium, vanadium and zinc.

7. The ink of claim 6, wherein the metallo-organic components comprise one or more of aluminum, zinc, vanadium and titanium.

8. The ink of claim 1, further comprising a phosphorus-containing compound.

9. The ink of claim 1, further comprising a modifier, including a metal oxide, or a colloidal metal suspension.

10. The conductive ink of claim 1, wherein the solid metal oxide phase comprises at least 2% by weight solid content.

11. The conductive ink of claim 1, wherein the plurality of metallo-organic components have a decomposition temperature of above 200° C.

12. The conductive ink of claim 11, wherein the plurality of metallo-organic components have a decomposition temperature in the range from about 200° C. to about 500° C.

13. A conductive ink for application to a semiconductor substrate for use as a photovoltaic cell comprising a plurality of solid metal oxide phase-forming precursors that form a solid metal oxide phase upon firing or heating, one or more of the precursors comprising silicon and boron and a precursor selected from the group consisting essentially of one of gallium, indium, thallium, germanium, tin, bismuth, arsenic, antimony and vanadium and capable of forming one or more conductive metal elements upon firing, the ink being substantially free of glass frit, and the ink adapted to adhere to the surface of a substrate upon application to the substrate and, upon firing, to decompose the one or more precursors that form a solid metal oxide phase which promotes the one or more conductive metal elements to form an electrical conductor on the substrate in the absence of a glass frit.

14. The ink of claim 13, wherein upon application of the ink to an anti-reflection coating disposed on the substrate, the conductive ink is capable of penetrating the anti-reflection coating to form ohmic contact with the substrate.

15. The ink of claim 13, wherein the plurality of precursors are present in an amount less than about 90% by weight.

16. The ink of claim 13, wherein the plurality of precursors further comprise aluminum, titanium, and zinc.

17. The ink of claim 13, wherein the plurality of precursors include a phosphorus-containing compound.

18. The ink of claim 13, further comprising a modifier, including a metal oxide or a colloidal metal suspension.

* * * * *